United States Patent [19]
Fukutake et al.

[11] Patent Number: 5,473,118
[45] Date of Patent: Dec. 5, 1995

[54] PRINTED CIRCUIT BOARD WITH A COVERLAY FILM

[75] Inventors: Sunao Fukutake; Kazuhiko Ohashi; Akira Urakami, all of Okayama, Japan

[73] Assignee: Japan Gore-Tex, Inc., Japan

[21] Appl. No.: 268,602

[22] Filed: Jun. 30, 1994

[30]    Foreign Application Priority Data

Jul. 1, 1993   [JP]   Japan .................................... 5-189310

[51] Int. Cl.⁶ ..................................................... H05K 1/00
[52] U.S. Cl. ........................... 174/258; 174/250; 174/259
[58] Field of Search ..................................... 174/250, 256, 174/258, 259

[56]          References Cited

U.S. PATENT DOCUMENTS 5,034,801  7/1991  Fischer .
5,089,346  2/1992  Imaizumi et al. .
5,171,826  12/1992 Imaizumi et al. .
5,234,522  8/1993  Suzuki et al. .
5,260,130  11/1993 Sakaguchi et al. .

FOREIGN PATENT DOCUMENTS 0248617   12/1987  European Pat. Off. .
0331429    9/1989  European Pat. Off. .
58-108788   6/1983  Japan .
5160558     6/1993  Japan .

*Primary Examiner*—Leo P. Picard
*Assistant Examiner*—Cheryl R. Figlin
*Attorney, Agent, or Firm*—Gary A. Samuels

[57]          ABSTRACT

A printed circuit board assembly having a coverlay film which is a composite film consisting of a porous fluoropolymer film coated with a thermoplastic or heat-curing adhesive is disclosed. The coverlay film has excellent conformability and adhesion to the printed circuit board and low dielectric constant.

14 Claims, 1 Drawing Sheet

PRINTED CIRCUIT BOARD WITH A COVERLAY FILM

FIELD OF THE INVENTION

The invention relates to printed circuit boards having films for covering and protecting them from chemical, environmental and mechanical damage.

BACKGROUND OF THE INVENTION

Printed circuit boards commonly have protection from chemical attack and mechanical damage which may occur during portions of their processing, or in subsequent use. For rigid printed circuit boards protection is often provided by a polymer coating or covering, for example, an epoxy or polyimide polymer, applied to the exposed surface.

For flexible printed circuit boards the protective material has the additional requirement that it be capable of being flexed without loss of adhesion or cracking. Protection in these cases is frequently provided by composite films known as coverlay films. These coverlay films generally consist of a tough, flexible, non-porous plastic film having a layer of flexible adhesive on it. The non-porous plastic film used in a coverlay film is often a polyester polymer film or a film of a polyimide polymer, such as Kapton® or Apical®.

The adhesive used in a coverlay film is typically a synthetic polymer material having a low glass transition temperature (Tg), such as an acrylic elastomer resin. While these adhesive materials provide good flexibility and room temperature adhesion, they have limited chemical resistance, poor thermal performance, poor moisture resistance, and are not inherently self-extinguishing. Additionally, they have relatively high dielectric constants (Er) compared to the dielectric materials used in printed circuit boards for high frequency service. The adhesive of the coverlay must be sufficiently thick, typically more than 20 micrometers, in order to encapsulate and protect the printed electrical conductors and circuitry on the surface of the printed circuit board. The amount of adhesive required can raise the dielectric constant (Er) of the coverlay to as high as 4.2 to 4.5 and, when the coverlay is applied to the printed circuit board, may raise the dielectric constant of the whole assembly to undesirable levels thus increasing signal delay time and cross-talk characteristics of the assembly.

The coverlay films described above are generally laminated and molded to the surface of a printed circuit board by application of heat and compressive force, most often in a vessel or container operated under vacuum. As the coverlay is laminated the adhesive flows to fill the spaces between the printed conductors and bonds the coverlay to the printed circuit board. The need for the adhesive to flow can lead to further problems.

In many instances punched or drilled holes are made in the coverlay prior to lamination in order to provide access through the coverlay to the circuitry it covers. It is desirable that these holes be as small as possible, however, during lamination of the coverlay to the printed circuit board the adhesive tends to flow laterally which can result in closure of the access holes. This imposes further limitations on adhesive material selection and on manufacturing processes for their application that can require unwanted compromises that influence conductor spacing, access hole size, materials selection, manufacturing methods, and other factors that can affect the performance and value of the assembly.

SUMMARY OF THE INVENTION

The invention provides a printed circuit board protected with a coverlay film; the coverlay film having excellent conformability and adhesion to the printed circuits and substrate as well as excellent flexibility and rheological properties, and low dielectric constant.

More specifically, the invention is for a circuit board comprising a dielectric substrate with electrical conductors printed on its surface and having a protective coverlay film laminated to its surface. In one embodiment of the invention the coverlay film is a composite film comprising a porous fluoropolymer film coated on at least one surface with a layer of polymeric adhesive resin. The composite film is laminated to the surface of the printed circuit board and conforms closely to the surfaces of the printed conductors and to the substrate thus filling substantially all the space between the printed conductors with the porous fluoropolymer film. The adhesive is in contact with and bonded to the surfaces of the conductors and substrate, and excess adhesive is forced into the pores of the porous fluoropolymer film which serves as a matrix to accept the excess adhesive and restrain the adhesive from lateral flow and segregation.

In another embodiment of the invention the coverlay film is a composite film comprising a porous fluoropolymer film that has the surface region of at least one surface filled with a polymeric adhesive resin. The composite film is laminated to the surface of the printed circuit board and conforms closely to the surfaces of the printed conductors and to the substrate thus filling substantially all the space between the printed conductors with the porous fluoropolymer film. The adhesive is in contact with and bonded to the surfaces of the conductors and substrate, the porous fluoropolymer film serving as a matrix to restrain the adhesive from lateral flow and segregation.

In yet other embodiments of the invention, to provide additional protection against damage, each of the embodiments described above further comprise a non-porous synthetic polymer film laminated to the surface of the porous fluoropolymer film away from the printed circuit board.

DETAILED DESCRIPTION OF THE INVENTION

Figure 1:
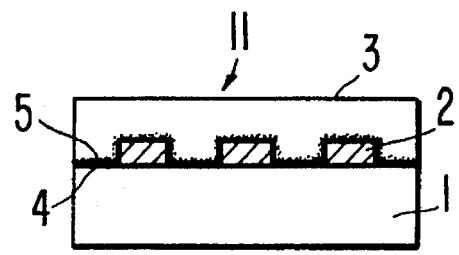
FIG. 1 is a cross-sectional view of an embodiment of the invention having a coverlay film initially coated on one surface with a layer of adhesive.

FIG. 1 depicts, in cross-sectional view, an assembly 11 consisting of a dielectric substrate 1 of a printed circuit board on which is printed a pattern of electrical conductors 2, and a coverlay film consisting of a porous fluoropolymer film 3 coated with a layer of adhesive 4 laminated to the surfaces of the electrical conductors 2 and substrate 1; a region 5 of the fluoropolymer film 3 contains excess adhesive forced into the pores during lamination.

No particular limitations are imposed on the selection of materials forming the dielectric substrate 1, or on the materials and methods of printing the electrical circuitry 2 on a dielectric substrate to form a printed circuit board of the invention. Printed circuit boards of many types are commercially available, and the materials and methods of their manufacture are well known in the art. Printed circuit boards suitable for use in the invention include single- and multilayer boards, rigid and flexible boards, and the like. Virtually all printed circuit boards, depending on their use, may require protection from environmental, chemical, or mechanical damage. In many cases in which weight, space, and flexibility considerations are relatively unimportant, the protection can be provided by simple potting or encapsulation methods. This invention, although generally applicable, is directed principally to flexible printed circuit boards or printed circuit boards used at high operating frequency, and in which mechanical, electronic, and thermal performance characteristics, as well as space and weight considerations are more difficult to satisfy.

The coverlay film used in the invention combines excellent thermal, mechanical, adhesion, and moisture-resistance properties; controls the rheology of the system by inhibiting lateral flow and segregation of the adhesive and, moreover, has a low dielectric constant; and thus provides maximum protection to the printed circuit board while maintaining or enhancing the electronic performance characteristics of the printed circuit board.

In one embodiment of the invention the coverlay film is a composite film comprising a porous film of a fluoropolymer material 3 coated with a layer of adhesive 4. Although porous films of synthetic polymers, for example, polyethylene, polypropylene, and the like, can be used; fluoropolymers, including tetrafluoroethylene/(perfluoroalkyl) vinyl ether copolymer (PFA), tetrafluoroethylene/hexafluoropropylene copolymer (FEP), and polytetrafluoroethylene (PTFE), chlorotrifluoroethylene (PCTFE), and the like, are preferred for their processing characteristics, temperature resistance, chemical inertness, and dielectric properties. Porous fluoropolymer film suitable for use in the coverlay of the invention can be made by processes known in the art, for example, by stretching or drawing processes, by papermaking processes, by processes in which filler materials are incorporated with the fluoropolymer resin and which are subsequently removed to leave a porous structure, or by powder sintering processes. Most preferred is a porous film of polytetrafluoroethylene. Preferably the porous polytetrafluoroethylene film is porous expanded polytetrafluoroethylene having a structure of interconnected nodes and fibrils, as described in U.S. Pat. Nos. 3,953,566 and 4,187,390, which fully describe the preferred material and processes for making them, and are incorporated herein by reference.

The porous fluoropolymer film 3 should have a thickness in the range 5 to 500 micrometers, preferably in the range 10 to 200 micrometers; a pore volume in the range 20 to 98 percent, preferably in the range 40 to 90 percent; and a nominal pore size in the range 0.1 to 10 micrometers, preferably in the range 0.2 to 5 micrometers. The fluoropolymers listed above have dielectric constants (Er) of 3 or less and, in porous film form, Er is often less than 2. Additionally, porous films of the above fluoropolymers are strong and have excellent flexural durability properties, and are also relatively soft and are highly flexible and compliant.

Referring still to FIG. 1, adhesive 4 is applied to the surface of the porous fluoropolymer film 3 to form a discrete layer on the surface of the porous fluoropolymer film 3.

After the adhesive has been applied to form the composite coverlay film, holes through the coverlay film may be drilled or punched at appropriate locations before lamination to provide access to printed circuits after the coverlay film has been laminated to the printed circuit board.

Material for the adhesive layer 4 can be selected from among many polymers commonly used in the electronics industry in the manufacture of printed circuit boards, for example, polyester and epoxy resins can be used. Preferably, the adhesive 4 is a thermoplastic or thermosetting polymer that has a dielectric constant (Er) of 4 or less. Examples of suitable adhesive polymers include, but are not limited to, polyimide resin (Er-3.4), bismaleimide triazine resin (Er-2.9–3.4), cyanate ester resin (Er-2.5–3.0), epoxy resin (Er-3.0–5.0), polyphenyl ether resin (Er-2.7), polyphenylene oxide resin (Er-2.7), FEP resin (Er-2.1), PFA resin (Er-2.1), and ethylene/tetrafluoroethylene copolymer (ETFE) resin (Er-2.4).

The amount of adhesive 4 forming the layer on the porous fluoropolymer film 3 of the coverlay film must be sufficient to uniformly contact and bond to the surfaces of the dielectric substrate 1 and printed conductors 2. At the same time it is desirable that the amount of adhesive in the coverlay film be kept low so as to keep the Er of the coverlay film as low as possible, and to prevent lateral flow of the adhesive which can result in closure of pre-formed holes for access to circuitry or in segregation of the adhesive into pockets of high concentration and locally high Er. The adhesive should be applied in an amount equal to 5% to 100%, preferably in the range 20% to 100%, of the pore volume of the porous fluoropolymer film after the coverlay film has been compressed by lamination to the printed circuit board. When the amount of adhesive forming the layer is less than 20% of the post-compression pore volume of the porous fluoropolymer film inadequate adhesive strength between the film and bonded surfaces is obtained. When the amount of adhesive forming the layer is greater than 100% of the post-compression pore volume of the porous fluoropolymer film the adhesive resin tends to flow, and may close pre-formed holes in the coverlay film or form pockets of high adhesive concentration, and cause an increase in the dielectric constant of the assembly. Typically, the amount of adhesive 4 applied to form the layer on the surface of the porous fluoropolymer film 3 will be in the range of 5% to 30% of the initial pore volume of the porous fluoropolymer film. For example, in preparing a coverlay film consisting of a 100 micrometers thick porous fluoropolymer film 3 having an initial pore volume of 80%, and a 5 micrometers thick adhesive layer 4; the amount of adhesive applied to form the layer will be in the range 6–7% of the initial pore volume of the porous fluoropolymer film.

The adhesive can be easily prepared to form a layer of the desired thickness, for example, by dissolving or suspending the adhesive resin in an organic solvent solution and adjusting the viscosity of the solution to about 100 to 200 centipoise. The adhesive can then be applied by conventional methods such as roll-coating, dip-coating, and the like, after which the solvent is removed by evaporation, oven-drying, or other convenient method. Thermoplastic and thermosetting adhesive resins can also be applied as a hot-melt coating by methods well known in the art. Any suitable method of coating can be used so long as the amount of adhesive applied is controlled within desired limits.

Lamination of the coverlay film to the printed circuit board may be done by application of heat and pressure using conventional processes. The coverlay film is pressed against the surfaces of the substrate 1 and electrical conductors 2, for example, by a conformal pad on a heated platen, or by heated rolls having a conformal surface, such as a silicone rubber, so that the porous fluoropolymer film 3 conforms to substantially the exact contours of the surfaces of the conductors 2 and substrate 1. As the coverlay film is pressed against the printed circuit board the soft flexible porous fluoropolymer film is compressed and assumes essentially the exact contours of the surfaces of the electrical conductors 2 and the substrate 1 while a portion of the adhesive 4 is forced into the pores of the porous fluoropolymer film 3, thus creating a region 5 in the porous fluoropolymer film which contains adhesive. The porous fluoropolymer film provides a preferred escape path for the adhesive, and a large amount of the adhesive is taken up into the region 5 of the porous fluoropolymer film. As a result, a thin adhesive bond line, about 0.5 to 5 micrometers thick, is formed between the porous fluoropolymer film 3 and the surfaces of the printed conductors 2 and substrate 1 and substantially all the space between the electrical conductors 2 on the dielectric substrate 1 is occupied by the fluoropolymer film, even in the corners formed by the printed conductors and the substrate.

The porous structure of the fluoropolymer film in the region 5 serves as a matrix which holds in place the adhesive contained in it, much as a sponge holds water. The porous matrix prevents the adhesive from flowing laterally and segregating in the corners formed by the conductors and the substrate as well as preventing the adhesive from flowing and closing pre-formed holes in the coverlay film. The porous fluoropolymer film matrix also serves to reinforce and toughen the adhesive, thereby improving its ability to flex without loss of adhesion or dielectric breakdown.

During lamination the soft flexible porous fluoropolymer film is compressed and a significant reduction of the pore volume of the porous film takes place as air is expelled from the film. Thus, the quantity of adhesive applied to form the coverlay film now represents an amount in the range 20% to 100% of the pore volume of the compressed film. It is important that the coverlay film not be over-compressed during lamination so that the amount of adhesive exceeds the post-compression pore volume. If over-compression occurs the adhesive will be squeezed out of the region 5, will flow laterally along the substrate and may locally displace the fluoropolymer film from its proximity to the surfaces of the conductors and substrate and segregate to create pockets of high adhesive concentration which can lead to loss of flex properties and non-uniformities in the dielectric constant of the printed circuit board. Also, over-compression can result in lateral flow of the adhesive that leads to obstruction or closure of pre-formed holes in the coverlay film.

Figure 2:
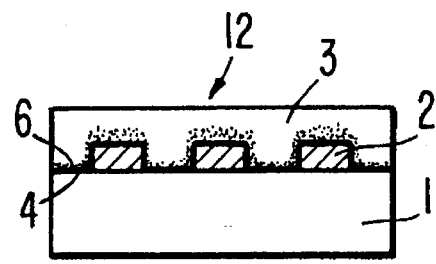
FIG. 2 is a cross-sectional view of an embodiment of the invention having a coverlay film with a surface region filled with an adhesive.

Another embodiment of the invention is depicted in FIG. 2. Shown in a cross-sectional view is an assembly 12 consisting of a dielectric substrate 1 of a printed circuit board on which is printed a pattern of electrical conductors 2; a coverlay film consisting of a porous fluoropolymer film 3 which has the pores of one surface region 6 filled with an adhesive 4; the coverlay film is laminated to the surfaces of the electrical conductors 2 and substrate 1.

As stated in the description above, no particular limitations are imposed on the selection of materials forming the dielectric substrate 1, or on the materials and methods of printing the electrical circuitry 2 on a dielectric substrate to form a printed circuit board of the invention.

In this embodiment, the coverlay film is also a composite film comprising a porous film of fluoropolymer material 3 and a polymeric adhesive 4. The difference is that, in this embodiment, the surface region of at least one side of the porous fluoropolymer film 3 is impregnated with the adhesive 4 to form in the porous fluoropolymer film a region 6 that contains adhesive before the coverlay film is laminated. Thus, the embodiment shown in FIG. 2 does not have a discrete layer of adhesive formed on the surface of the porous fluoropolymer film as described in the first embodiment above and shown in FIG. 1.

Again, the porous film comprised in the coverlay film can be of the materials listed earlier and, as described in the first embodiment, porous film of fluoropolymer material is preferred, most preferably film of expanded polytetrafluoroethylene.

With reference to FIG. 2, adhesive 4 is applied to the surface of the porous fluoropolymer film 3 and impregnated into the pores at the surface of the porous fluoropolymer film to form an adhesive-containing region 6 extending from the surface inward in the porous fluoropolymer film. Little or no adhesive remains above the surface. After the adhesive 4 has been impregnated into the porous fluoropolymer film 3 to form the composite coverlay film, holes through the coverlay film may be drilled or punched before lamination at appropriate locations to provide access to printed circuits after the coverlay film has been laminated to the printed circuit board.

The polymeric adhesive material used to impregnate the porous fluoropolymer film is selected from the same materials described hereinabove in the first embodiment. As in the first embodiment, the amount of adhesive 4 impregnated into the region 6 of the porous fluoropolymer film 3 of the coverlay film must be sufficient to uniformly contact with and bond to the surface of the dielectric substrate I and printed conductors 2. At the same time it is desirable that the amount of adhesive in the coverlay film be kept low so as to keep the Er of the coverlay film as low as possible, and to prevent lateral flow of the adhesive which, as explained earlier, can result in closure of pre-formed holes for access to circuitry or in segregation of the adhesive into pockets of high concentration and locally high Er. Again, as described above and for the same reasons, the adhesive should be applied in an amount equal to 5% to 100%, preferably in the range 20% to 100%, of the pore volume of the porous fluoropolymer film after the coverlay film has been compressed by lamination to the printed circuit board. Typically, the amount of adhesive 4 impregnated into the surface of the porous fluoropolymer film 3 will be in the range of 5% to 30% of the initial pore volume of the porous fluoropolymer film. In terms of impregnation depth, depending on the thickness of the porous fluoropolymer film, the adhesive-impregnated region 6 should be in the range 1 to 50 micrometers, preferably in the range 5 to 20 micrometers thick.

The adhesive can be easily prepared to impregnate and form a region of the desired thickness, for example, by dissolving or suspending the adhesive resin in an organic solvent solution and adjusting the viscosity of the solution to about 30 to 100 centipoise. The adhesive can then be applied by conventional methods such as roll-coating, dip-coating, and the like, after which the solvent is removed by evaporation, oven-drying, or other convenient method. Thermoplastic and thermosetting adhesive resins can also be impregnated as a hot-melt by methods well known in the art, for example, by hot-roll coating followed by passage through the nip between heated rolls to force the adhesive into the porous fluoropolymer film or, alternatively, forcing the adhesive into the porous fluoropolymer film using hot platens. Any suitable method of impregnation can be used so long as the amount of adhesive applied is controlled within desired limits.

Lamination of the coverlay film to the printed circuit board may be done by application of heat and pressure using conventional processes. The coverlay film is pressed against the surfaces of the substrate 1 and electrical conductors 2, for example, by a conformal pad on a heated platen, or by heated rolls having a conformal surface, such as a silicone rubber, so that the porous fluoropolymer film 3 conforms to substantially the exact contours of the surfaces of the conductors 2 and substrate 1. As the coverlay film is pressed against the printed circuit board the soft flexible porous fluoropolymer film is compressed and assumes essentially the exact contours of the surfaces of the electrical conductors 2 and the substrate 1. The adhesive 4 at the surface of region 6 of the porous fluoropolymer film 3 contacts with and bonds to the surfaces of the electrical conductors 2 and substrate 1. Virtually all the adhesive 4 is contained in region 6 of the porous fluoropolymer film, therefore virtually all the space between the electrical conductors 2 on the dielectric substrate 1 is occupied by the fluoropolymer film, even in the corners formed by the printed conductors and the substrate. Despite this fact a strong effective bond is made between the coverlay and the surfaces of the printed circuit board.

Since almost all the adhesive is contained in region 6 of the porous fluoropolymer film 3 the porous fluoropolymer film matrix is especially effective in preventing lateral flow of the adhesive and further reduces the possibility of segregation of the adhesive and closure of pre-formed holes in the coverlay film. The porous fluoropolymer film matrix also serves to reinforce and toughen the adhesive, thereby improving its ability to flex without loss of adhesion or dielectric breakdown.

Also as described above, during lamination the soft flexible porous fluoropolymer film is compressed and a significant reduction of the pore volume of the porous film takes place as air is expelled from the film. Thus, the quantity of adhesive applied to form the coverlay film now represents an amount in the range 20% to 100% of the pore volume of the compressed film. It is important in this embodiment also that the coverlay film not be over-compressed during lamination so that the amount of adhesive exceeds the post-compression pore volume. If over-compression occurs the adhesive will be squeezed out of the region 6, will flow laterally along the substrate and may locally displace the fluoropolymer film from its proximity to the surfaces of the conductors and substrate and segregate to create pockets of high adhesive concentration which can lead to loss of flex properties and non-uniformities in the dielectric constant of the printed circuit board. Likewise, lateral flow of the adhesive can result in obstruction or closure of pre-formed holes in the coverlay film.

Figure 3:
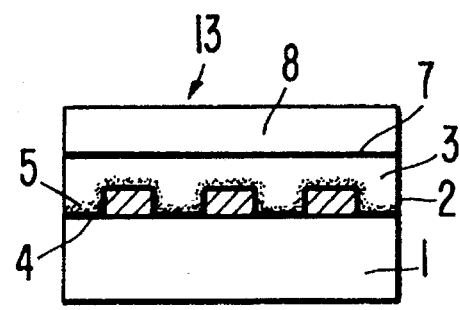
FIG. 3 is a cross-sectional view of the embodiment of FIG. 1 with a non-porous film laminated to the surface away from the printed circuit board.
Figure 4:
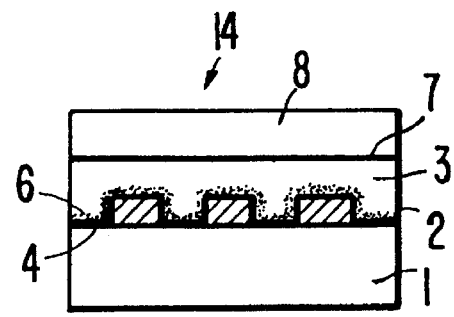
FIG. 4 is a cross-sectional view of the embodiment of FIG. 2 with a non-porous film laminated to the surface away from the printed circuit board.

Additional embodiments of the invention are shown in FIGS. 3 and 4. In FIG. 3 is shown an assembly 13 consisting of a dielectric substrate 1 of a printed circuit board on which is printed a pattern of electrical conductors 2, and a coverlay film consisting of a porous fluoropolymer film 3 coated with a layer of adhesive 4 laminated to the surfaces of the electrical conductors 2 and substrate 1; a region 5 of the fluoropolymer film 3 contains excess adhesive forced into the pores during lamination. The assembly 13, which is otherwise the assembly depicted in FIG. 1, further comprises a coverlay film having a non-porous synthetic polymer film 8 laminated to the surface of porous fluoropolymer film 3 away from the printed circuit board by means of an adhesive 7.

In FIG. 4 is shown an assembly 14 consisting of a dielectric substrate 1 of a printed circuit board on which is printed a pattern of electrical conductors 2; a coverlay film comprising a porous fluoropolymer film 3 which has the pores of one surface region 6 filled with an adhesive 4. The assembly 14, which is otherwise the assembly depicted in FIG. 2, further comprises a coverlay film having a non-porous synthetic polymer film 8 laminated to the surface of porous fluoropolymer film 3 away from the printed circuit board by means of an adhesive 7. The coverlay film is laminated to the surfaces of the electrical conductors 2 and substrate 1.

The non-porous polymer film 8 is used to provide additional resistance to mechanical, chemical, and environmental damage to the assembly. The non-porous polymer film 8 can be a non-porous film of polyimide polymer, polyester polymer, fluoropolymer, or polyolefin polymer. Preferred are non-porous films of polyimide or polyester polymers. The non-porous polymer film should be in the range 1 to 125 micrometers thick, preferably in the range 5 to 25 micrometers thick.

The non-porous polymer film 8 can be laminated to the porous fluoropolymer film 3 by methods well known in the art. For example, a layer of adhesive 7 of the types described above can be applied to the surface of the porous fluoropolymer film 3 away from the printed circuit board, and lamination to the porous fluoropolymer film 3 effected by application of heat and pressure. Adhesive to bond the non-porous polymer film 8 to the porous fluoropolymer film 3 can also be applied so as to form a layer on the porous fluoropolymer film, or to be impregnated into the porous fluoropolymer film, as described hereinabove. Alternatively, heat-bonding methods can be used to laminate non-porous films of thermoplastic materials having suitable melting temperatures to the porous fluoropolymer film without the use of an adhesive.

Lamination of the embodiments of FIGS. 3 and 4 to the printed circuit board are accomplished as described for the embodiments of FIGS. 1 and 2.

EXAMPLE 1

One part-by-weight (pbw) of a heat-curing polyimide powder was dissolved in a mixture of dioxane (1 pbw), n-methyl pyrrolidone (3 pbw) and dimethyl formamide (5 pbw) to form a solution with a viscosity of 150 centipoise.

A porous film of expanded polytetrafluoroethylene 100 micrometers thick having a pore volume of 80%, a nominal pore size of 0.2 micrometers, and a dielectric constant of 1.16 was coated on one side with the solution and dried for 5 minutes at a temperature of about 170° C. The coverlay film thus produced had a polyimide adhesive coating layer 5 micrometers thick and a dielectric constant of 1.6.

The coverlay film was superposed on a rigid printed circuit board with the adhesive surface facing the printed surface of the printed circuit board. The printed circuit board consisted of a dielectric substrate of polyimide-impregnated fiberglass cloth having a pattern of copper conductors (50 micrometers thick) printed on its surface. The coverlay film was laminated to the printed circuit board using a heated platen press at a temperature of about 200° C. for 120 minutes under a compressive force of 10 kg/cm$^2$.

The printed circuit board assembly with coverlay thus obtained was a good product in which no lateral flow of the adhesive was observed. When tested and compared to Comparative Example 1 signal transmission speed was increased by about 10%, and cross-talk was reduced by about 50%.

EXAMPLE 2

Both sides of a porous film of expanded polytetrafluoroethylene were coated by dip-coating with bismaleimide triazine resin (Er-3.4; viscosity - 130 centipoise). The porous expanded polytetrafluoroethylene film was 30 micrometers thick and had a pore volume of 80%, a nominal pore size of 0.2 micrometers, and a dielectric constant of 1.16. The bismaleimide triazine resin layer on each side was about 5 micrometers thick.

A non-porous polyimide polymer film 25 micrometers thick (dielectric constant of 3.2) was laminated to one side of the bismaleimide triazine resincoated expanded polytetrafluoroethylene film using a hot roll at a temperature of 100° C., a speed of 1 meter/minute, and a compressive force of 2 kg/cm². The coverlay film thus produced had a dielectric constant of 2.4.

The coverlay film was superposed on a flexible printed circuit board (dielectric constant-2.4) with the adhesive surface facing the printed surface of the printed circuit board. The printed circuit board consisted of a dielectric substrate of polytetrafluoroethylene-impregnated fiberglass cloth having a pattern of copper conductors (35 micrometers thick) printed on its surface. The coverlay film was laminated to the printed circuit board using a heated platen press at a temperature of about 180° C. for 120 minutes under a compressive force of 10 kg/cm².

The printed circuit board assembly with coverlay thus obtained was a good product in which no lateral flow of the adhesive was observed. It was also observed that the bond line between the coverlay film and printed circuit board was very thin, and that the bismaleimide triazine resin had been substantially taken into the porous expanded polytetrafluoroethylene film. When tested and compared to Comparative Example 1 signal transmission speed was increased by about 10%, and cross-talk was reduced by about 50%.

EXAMPLE 3

Both sides of a porous film of expanded polytetrafluoroethylene were coated by dip-coating with bismaleimide triazine resin (Er-3.4; viscosity - 130 centipoise). The porous expanded polytetrafluoroethylene film was 80 micrometers thick and had a pore volume of 80%, a nominal pore size of 0.2 micrometers, and a dielectric constant of 1.16. The bismaleimide triazine resin layer on each side was about 5 micrometers thick.

A non-porous polyimide polymer film 25 micrometers thick and having a dielectric constant of 3.2 was laminated to one side of the bismaleimide triazine resin-coated expanded polytetrafluoroethylene film using a hot roll at a temperature of 100° C., a speed of 1 meter/minute, and a compressive force of 1 kg/cm². The bismaleimide triazine resin was impregnated into both surfaces of the porous expanded polytetrafluoroethylene film to a depth of about 5 micrometers. The prepreg coverlay film thus produced had a dielectric constant of 2.0.

The coverlay film was superposed on a flexible printed circuit board with the non-porous polyimide film surface away from the printed surface of the printed circuit board. The printed circuit board was a flexible board as described in Example 2. The coverlay film was laminated to the printed circuit board using a heated platen press at a temperature of about 180° C. for 120 minutes under a compressive force of 10 kg/cm².

The printed circuit board assembly with coverlay thus obtained was a good product in which no lateral flow of the adhesive was observed. The printed circuit board assembly had a dielectric constant of 2.1. It was also noted that a discrete bond zone containing adhesive between the coverlay film and printed circuit board could not be observed, and that the bismaleimide triazine resin had substantially remained in the porous expanded polytetrafluoroethylene film. When tested and compared to Comparative Example 1 signal transmission speed was increased by about 10%, and cross-talk was reduced by about 50%.

COMPARATIVE EXAMPLE 1

One side of a 25 micrometers thick non-porous polyimide film (Er-3.2) was coated with a 35 micrometers thick layer of epoxy resin (Er-4.6) to form a coverlay film.

The coverlay film was laminated to a flexible printed circuit board of the type described in Example 2. The printed circuit board assembly thus produced had a dielectric constant of 2.6.

Signal transmission speed and cross-talk characteristics of this printed circuit board assembly were poor.

We claim:

1. A printed circuit board comprising a dielectric substrate with electrical conductors printed on its surface and having a protective coverlay film laminated to its outer printed surface, said coverlay film being a composite film comprising:

a porous fluoropolymer film coated with a polymeric adhesive resin, said adhesive resin forming a coating layer on at least one surface of said porous fluoropolymer film, wherein said composite film is laminated over the surface of said conductors of said printed circuit and conforms closely to the surfaces of said conductors and to the surface of the substrate supporting said conductors, whereby the adhesive is in contact with and bonded to the surfaces of said conductors and said substrate, and excess adhesive is forced into the pores of said porous fluoropolymer film, thus minimizing lateral flow and segregation of said adhesive.

2. The printed circuit board as recited in claim 1, wherein said composite film further comprises a non-porous film of synthetic polymer selected from the group consisting of polyimide polymers, polyester polymers, fluoropolymers, and polyolefin polymers laminated to one surface of said porous fluoropolymer film.

3. The printed circuit board as recited in claim 1, wherein the adhesive resin of said composite film is selected from the class consisting of thermoplastic or thermosetting synthetic polymers.

4. The printed circuit board as recited in claim 2, wherein the adhesive resin of said composite film is selected from the class consisting of thermoplastic or thermosetting synthetic polymers.

5. The printed circuit board as recited in claim 3, wherein the adhesive resin is selected from the group consisting of polyimide resin, bismaleimide triazine resin, cyanate ester resin, epoxy resin, polyphenylether resin, polyphenylene oxide resin, tetrafluoroethylene/hexafluoropropylene copolymer (FEP) resin, tetrafluoroethylene/(perfluoroalkyl) vinyl ether copolymer (PFA) resin, and ethylene/tetrafluoroethylene copolymer (ETFE) resin.

6. The printed circuit board as recited in claim 4, wherein the adhesive resin is selected from the group consisting of polyimide resin, bismaleimide triazine resin, cyanate ester resin, epoxy resin, polyphenylether resin, polyphenylene oxide resin, tetrafluoroethylene/hexafluoropropylene copolymer (FEP) resin, tetrafluoroethylene/(perfluoroalkyl) vinyl ether copolymer (PFA) resin, and ethylene/tetrafluoroethylene copolymer (ETFE) resin.

7. The printed circuit board as recited in claims 1, 2, 3, 4, 5, or 6, wherein the porous fluoropolymer film of said composite film is porous polytetrafluoroethylene.

8. A printed circuit board comprising a dielectric substrate with electrical conductors printed on its surface and having a protective coverlay film laminated to its outer printed surface, said coverlay film being a composite film comprising:

a porous fluoropolymer film having the surface region of at least one surface filled with a polymeric adhesive resin;

wherein said composite film is laminated over the surface of said conductors of said printed circuit and conforms closely to the surfaces of said conductors and to the surface of the substrate supporting said conductors, whereby the adhesive contacts with and bonds to the surfaces of said conductors and said substrate without lateral flow and segregation of said adhesive.

9. The printed circuit board as recited in claim 8, wherein said composite film further comprises a non-porous film of synthetic polymer selected from the group consisting of polyimide polymers, polyester polymers, fluoropolymers, and polyolefin polymers laminated to one surface of said porous fluoropolymer film.

10. The printed circuit board as recited in claim 8, wherein the adhesive resin of said composite film is selected from the class consisting of thermoplastic or thermosetting synthetic polymers.

11. The printed circuit board as recited in claim 9, wherein the adhesive resin of said composite film is selected from the class consisting of thermoplastic or thermosetting synthetic polymers.

12. The printed circuit board as recited in claim 10, wherein the adhesive resin is selected from the group consisting of polyimide resin, bismaleimide triazine resin, cyanate ester resin, epoxy resin, polyphenylether resin, polyphenylene oxide resin, tetrafluoroethylene/hexafluoropropylene copolymer (FEP) resin, tetrafluoroethylene/(perfluoroalkyl) vinyl ether copolymer (PFA) resin, and ethylene/tetrafluoroethylene copolymer (ETFE) resin.

13. The printed circuit board as recited in claim 11, wherein the adhesive resin is selected from the group consisting of polyimide resin, bismaleimide triazine resin, cyanate ester resin, epoxy resin, polyphenylether resin, polyphenylene oxide resin, tetrafluoroethylene/hexafluoropropylene copolymer (FEP) resin, tetrafluoroethylene/(perfluoroalkyl) vinyl ether copolymer (PFA) resin, and ethylene/tetrafluoroethylene copolymer (ETFE) resin.

14. The printed circuit board as recited in claims 8, 9, 10, 11, 12, or 13, wherein the porous fluoropolymer film of said composite film is porous polytetrafluoroethylene.

* * * * *